United States Patent
Hueting et al.

(10) Patent No.: US 6,320,223 B1
(45) Date of Patent: Nov. 20, 2001

(54) ELECTRONIC DEVICE COMPRISING A TRENCH GATE FIELD EFFECT DEVICE

(75) Inventors: Raymond J. E. Hueting, Helmond (NL); Adam R. Brown, Stockport (GB); Holger Schligtenhorst, Böblingen (DE); Mark Gajda, Stockport; Stephen W. Hodgskiss, Macclesfield, both of (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/527,277

(22) Filed: Mar. 17, 2000

(30) Foreign Application Priority Data

Mar. 18, 1999 (GB) .................................................. 9906247

(51) Int. Cl.$^7$ ................................................... H01L 29/76
(52) U.S. Cl. ........................... 257/341; 257/342; 257/401
(58) Field of Search ................................... 257/341, 342, 257/331, 401

(56) References Cited

U.S. PATENT DOCUMENTS 5,378,655    1/1995    Hutchings et al. .................. 437/203
5,387,528    2/1995    Hutchings et al. .................... 437/40

FOREIGN PATENT DOCUMENTS

0746030A2    12/1996    (EP) .

*Primary Examiner*—Mark V. Prenty
(74) *Attorney, Agent, or Firm*—Steven R. Biren

(57) ABSTRACT

A trench gate field effect device has a semiconductor body (2) with a trench (3) extending into a first major surface (2a) so as to define a regular array of polygonal source cells (4). Each source cell contains a source region (5a,5b) and a body region (6a,6b) with the body regions separating the source regions from a common further region (20). A gate (G) extends within and along said trench (3) for controlling a conduction channel through each of the body regions. Each source cell (4) has a central semiconductor region (60) which is more highly doped than said body regions, is of opposite conductivity type to the further region and forms a diode with the further region. Each source cell (4) has an inner trench boundary (3a) and an outer polygonal trench boundary (3b) with the inner trench boundary bounding a central subsidiary cell (10a) containing the central semiconductor region (60). A plurality of trench portions (30) radiate outwardly from the inner trench boundary (3a) to the outer trench boundary (3b) The trench portions separate the area between the inner and outer trench boundaries into a plurality of segments each having one side longer than another. Each segment forms a subsidiary source cell (10b).

14 Claims, 8 Drawing Sheets

ELECTRONIC DEVICE COMPRISING A TRENCH GATE FIELD EFFECT DEVICE

BACKGROUND OF THE INVENTION

This invention relates to an electronic device comprising a trench gate field effect device, particularly, but not exclusively, a trench insulated gate field effect power device such as a trench insulated gate power transistor.

U.S. Pat. No. 5,387,528 (our ref: PHB33804) describes an electronic device comprising a trench gate field effect device comprising a semiconductor body having first and second opposed major surfaces, and a trench extending into the first major surface so as to define at the first major surface a regular array of polygonal source cells each bounded by the trench. Each polygonal source cell contains a source region of one conductivity type and a body region of the opposite conductivity type with the body region separating the source regions from a common further region of the one conductivity type, generally a drain drift region. A gate extends within and along the trench for controlling a conduction channel through each of the body regions between the corresponding source region and the further region.

In order to increase the ruggedness of the device and to avoid undesired avalanche breakdown, each polygonal cell contains a central semiconductor region of the opposite conductivity type which is more highly doped than the body regions. This highly doped region controls the location of the avalanche breakdown in the polygonal source cells so that it is away from the trench gate and also delays switching of the diode formed by this region and the drain region of the device by controlling the hole current flow. This enables the onset of avalanche breakdown to be delayed until higher voltages and also allows the breakdown to be more controlled and reproducible from device to device.

Although such central highly doped regions improve the ruggedness of the device, the need for these central highly doped regions places an upper limit on the maximum number of cells per unit area of semiconductor that can be achieved which is lower than would otherwise be the case. Having a large number of source cells per unit area of the semiconductor is desirable because this increases the overall available channel width within the device and therefore enables a higher drain-source current and thus a lower specific ON resistance. This is particularly important for power switching capability. The specific ON resistance ($R_{DSon}$) is defined as $$\frac{V_{DS}}{J_{DS}} \cdot \frac{A}{Z}$$

where $V_{DS}$ is the drain source voltage, $J_{DS}$ is the drain source current per unit length, A is the active device area (that is excluding any passive peripheral termination) and Z is the perimeter of the current flow along the device.

In order to enable the number of source cells per unit area to be increased, EP-A-0746030 proposes, as described with reference to FIG. 6 of EP-A-0746030, that the central semiconductor or ruggedness region be omitted from the source cells and that 1 in N of the source cells be replaced by an inactive cell that contains only the ruggedness or central semiconductor region, that is 1 in N of the cells has no source region and will not contribute to the current carrying capability of the device. Alternatively, as disclosed with reference to FIG. 13 of EP-A-0746030, the ruggedness or central semiconductor regions are again omitted from the source cells and, for every n source cells, a group of source cells (a group of four in the example shown in FIG. 13b) are replaced by a single, large ruggedness cell which is active, that is it contains a source region, and also contains a central or ruggedness region. However, this requires, as discussed with reference to FIG. 13, that the ruggedness cells be larger than the remaining cells thus reducing the overall channel width and causing the specific ON resistance to be higher that which would have been possible if the ruggedness cells were not present.

SUMMARY OF THE INVENTION

It is an aim of the present invention to provide an electronic device comprising a trench gate field effect device which enables the device to be rugged whilst also providing for a reduced specific ON resistance.

In one aspect, the present invention provides an electronic device comprising a trench gate field effect device having a regular array of polygonal source cells each containing a source region and a body region and each being bounded by a trench containing a gate for controlling conduction through a conduction channel area of the body regions between the source regions of the source cells and a further region of the device with the trench defining, for each polygonal source cell, an inner and an outer trench boundary with the inner trench boundary bounding a relatively highly doped region of opposite conductivity to the further region for increasing the ruggedness of the device and the area between the inner and outer trench boundaries being separated into a plurality of irregular subsidiary source cells by portions of the trench radiating outwardly from the inner to the outer trench boundary.

In one aspect, the present invention provides an electronic device comprising a trench gate field effect device having a regular array of polygonal source cells each containing a source region and a body region and each being bounded by a trench containing a gate for controlling conduction through a conduction channel area of the body regions between the source regions and a further region of the device with the trench defining, for each polygonal source cell, an inner and an outer trench boundary with the inner trench boundary bounding a relatively highly doped region of opposite conductivity to the further region for increasing the ruggedness of the device and the area between the inner and outer trench boundaries being separated into a plurality of subsidiary source cells by portions of the trench radiating outwardly from the inner to the outer trench boundary with the subsidiary source cells being of a different shape from the shape of the area bounded by the inner trench boundary.

In one aspect, the present invention provides an electronic device comprising a trench gate field effect device as set out in claim 1.

Where the device is an enhancement mode device, then the body regions will be of opposite conductivity type to the source regions.

An electronic device comprising a trench gate field effect device in accordance with the present invention enables each polygonal source cell to have a relatively highly doped semiconductor region for improving the ruggedness of the device while also allowing the device to have a low specific ON resistance by increasing the overall channel width of the device by dividing the source cell into a plurality of subsidiary source cells using trench portions radiating outwardly from the inner to the outer trench boundary so that each of the trench portions defines part of the gate of the field effect device and contributes to the overall channel width and thus the overall current carrying capability of the device.

Various preferred features in accordance with the invention are set out in the dependent claims.

In an embodiment, there is provided an electronic device comprising a trench gate field effect device, comprising a semiconductor body having first and second opposed major surfaces, a trench extending into the first major surface so as to define at the first major surface a regular array of regular polygonal source cells each bounded by the trench, each source cell containing a source region and a body region with the body regions separating the source regions from a common further region, and a gate extending within and along said trench for controlling a conduction channel through each of the body regions between the corresponding source region and the further region, each source cell containing a central semiconductor region which is of opposite conductivity type to the further region and which is more highly doped than said body regions, wherein, for each polygonal source cell, said trench defines inner and outer coaxial trench boundaries with the inner trench boundary bounding a central subsidiary cell containing the central semiconductor region, and the trench having a plurality of trench portions radiating outwardly from the inner trench boundary to the outer polygonal trench boundary and separating the area between the inner and outer trench boundaries into a plurality of subsidiary peripheral cells, each subsidiary peripheral cell having a subsidiary source region and a subsidiary body region with the subsidiary body region providing adjacent the subsidiary peripheral cell boundary a conduction channel area through which a conduction channel between the associated subsidiary peripheral region and the further region is controllable by the gate. The inner and outer trench boundaries may both be hexagonal. The subsidiary peripheral cells are preferably irregular having one side longer than another.

In an embodiment there is provided an electronic device comprising a trench gate field effect device, comprising a semiconductor body having first and second opposed major surfaces, a trench extending into the first major surface so as to define at the first major surface a regular array of hexagonal source cells each bounded by the trench, each hexagonal source cell containing a source region and a body region with the body regions separating the source regions from a common further region, and a gate extending within and along said trench for controlling a conduction channel through each of the body regions between the corresponding source region and the further region, each hexagonal source cell containing a central semiconductor region which is of opposite conductivity type to the further region and which is more highly doped than said body regions, wherein, for each hexagonal source cell, said trench defines inner and outer coaxial hexagonal trench boundaries with the axes of symmetry of the inner and outer hexagonal trench boundaries being coincident, the inner trench boundary bounding a central subsidiary cell containing the central semiconductor region, and the trench having a plurality of trench portions radiating outwardly from respective different corners of the inner hexagonal trench boundary to corresponding corners of the outer hexagonal trench boundary and separating the area between the inner and outer hexagonal trench boundaries into a plurality of subsidiary peripheral cells surrounding the central subsidiary cell and enclosed within the outer trench boundary, each subsidiary peripheral cell having a subsidiary source region and a subsidiary body region with the subsidiary body region providing adjacent the trench boundary of the subsidiary peripheral cell a conduction channel area through which a conduction channel between the associated subsidiary source region and the further region is controllable by the gate.

In an embodiment, there is provided an electronic device comprising a trench gate field effect device, comprising a semiconductor body having first and second opposed major surfaces, a trench extending into the first major surface so as to define at the first major surface a regular array of regular source cells each bounded by the trench, each source cell containing a source region and a body region with the body regions separating the source regions from a common further region, and a gate extending within and along said trench for controlling a conduction channel through each of the body regions between the corresponding source region and the further region, each source cell containing a central semiconductor region which is of opposite conductivity type to the further region and which is more highly doped than said body regions, wherein, for each source cell, said trench defines coaxial inner and outer trench boundaries with the inner trench boundary defining a regular hexagon and the outer trench boundary being corrugated or castellated and having eighteen sides with each of a first set of six sides being opposed and parallel to a respective different one of the sides of the hexagonal inner trench boundary and being connected to the adjacent ones of said set by two consecutive sides such that adjacent sides of the outer trench boundary are at 60° to one another, the inner trench boundary bounding a central subsidiary cell containing the central semiconductor region, and the trench having a plurality of trench portions radiating outwardly from the inner trench boundary to the outer trench boundary with alternate trench portions extending between the midpoints of said opposed sides of the inner and outer trench boundaries and the remaining trench portions extending between corresponding corners of the inner and outer trench boundaries, the trench portions separating the area between the inner and outer trench boundaries into a plurality of subsidiary peripheral cells bounded by the trench, each subsidiary peripheral cell having a subsidiary source region and a subsidiary body region with the subsidiary body region providing adjacent the trench boundary of the subsidiary peripheral cell a conduction channel area through which a conduction channel between the associated subsidiary source region and the further region is controllable by the gate.

In an embodiment, there is provided an electronic device comprising a trench gate field effect device, comprising a semiconductor body having first and second opposed major surfaces, a trench extending into the first major surface so as to define at the first major surface a regular array of hexagonal source cells each bounded by the trench, each hexagonal source cell containing a source region and a body region with the body regions separating the source regions from a common further region, and a gate extending within and along said trench for controlling a conduction channel through each of the body regions between the corresponding source region and the further region, each hexagonal source cell containing a central semiconductor region which is of opposite conductivity type to the further region and which is more highly doped than said body regions wherein, for each hexagonal source cell, said trench defines inner and outer coaxial hexagonal trench boundaries with the inner trench boundary having its axes of symmetry offset by 30° from the axes of symmetry of the outer trench boundary and the inner trench boundary bounding a central subsidiary cell containing the central semiconductor region, the trench having a plurality of trench portions each radiating outwardly from a respective different corner of the inner trench boundary to a corresponding corner of the outer trench boundary, the trench portions separating the area between the inner and outer trench boundaries into a plurality of subsidiary peripheral cells such that each subsidiary peripheral cell has a boundary defined by the trench and the subsidiary peripheral cells surround the central subsidiary cell and are enclosed within the outer trench boundary, each subsidiary peripheral cell having a subsidiary source region and a subsidiary body region with the subsidiary body region providing adjacent the trench boundary of the subsidiary peripheral cell a conduction channel area through which a conduction channel between the associated subsidiary source region and the further region is controllable by the gate.

In preferred examples of each of the above embodiments, the source regions are semiconductor regions of one conductivity type and the body regions are of the opposite conductivity type separating the source regions from the further region which is also of the one conductivity type with the central semiconductor region being of the same conductivity type as and more highly doped than the body regions. Preferably, the one conductivity type is n conductivity type so that the trench gate field effect device forms an n channel enhancement mode device. As another possibility, a depletion mode device may be formed in which the body regions are of the same conductivity type as the further region.

In other examples, the source regions may be formed as Schottky contact regions rather than semiconductor regions.

BRIEF DESCRIPTION OF THE DRAWINGS

Embodiments of the present invention will now be described, by way of example, with reference to the accompanying drawings, in which.

Figure 1:
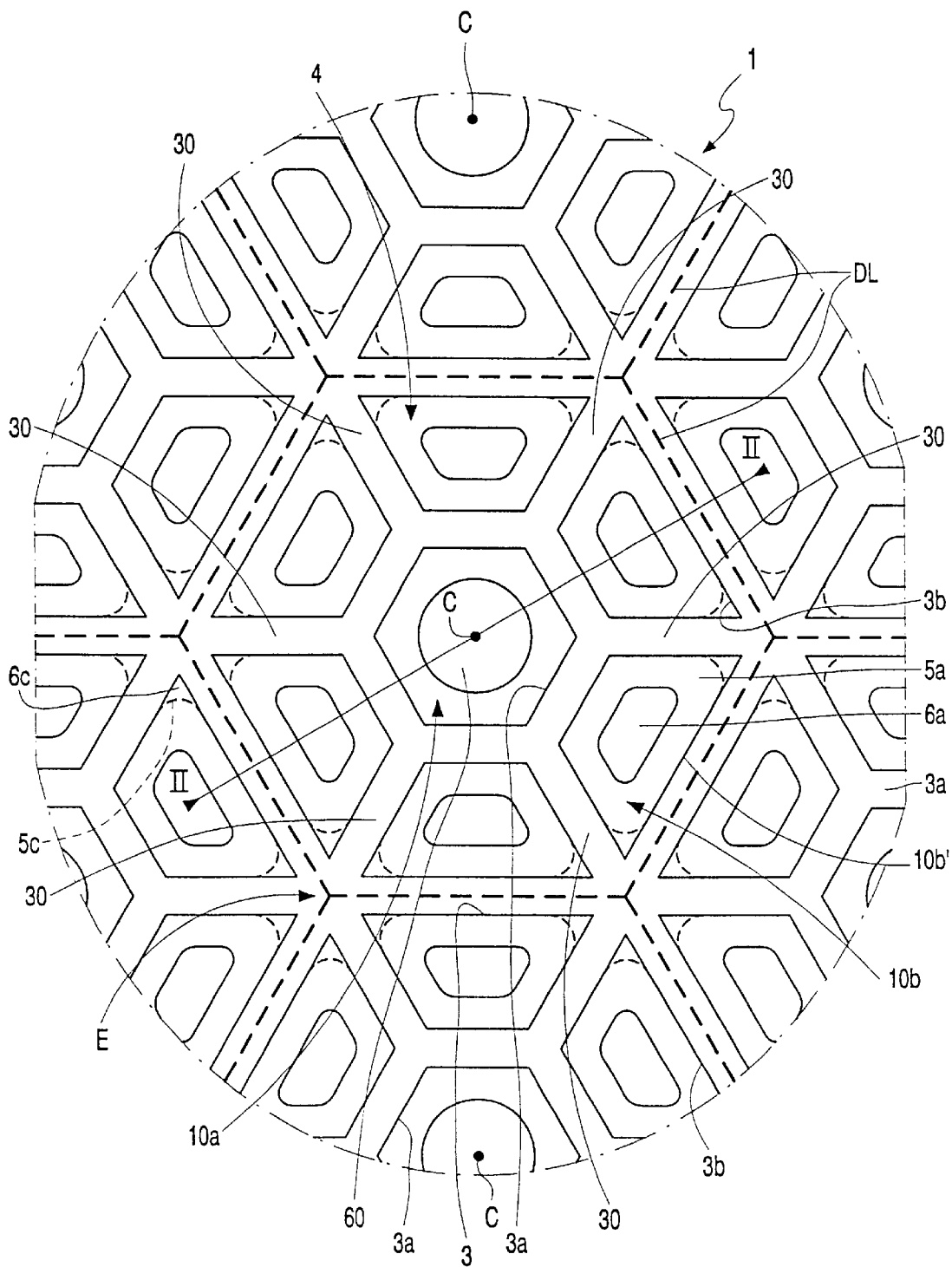
FIG. 1 shows a diagrammatic top plan view of part of an electronic device comprising a trench gate field effect device in accordance with a first embodiment of the invention with insulating and metallisation layers omitted from the top surface of the device so as to illustrate the geometric layout of a source or unit cell of the trench gate field effect device.

It should be noted that all the figures are diagrammatic and are not drawn to scale. Relative dimensions and proportions of parts in the drawings may have been shown exaggerated or reduced in size for the sake of clarity and convenience in the drawings. The same or similar reference signs are generally used to refer to corresponding or similar features in different embodiments.

DESCRIPTION OF THE PREFERRED EMBODIMENTS

Figure 2:
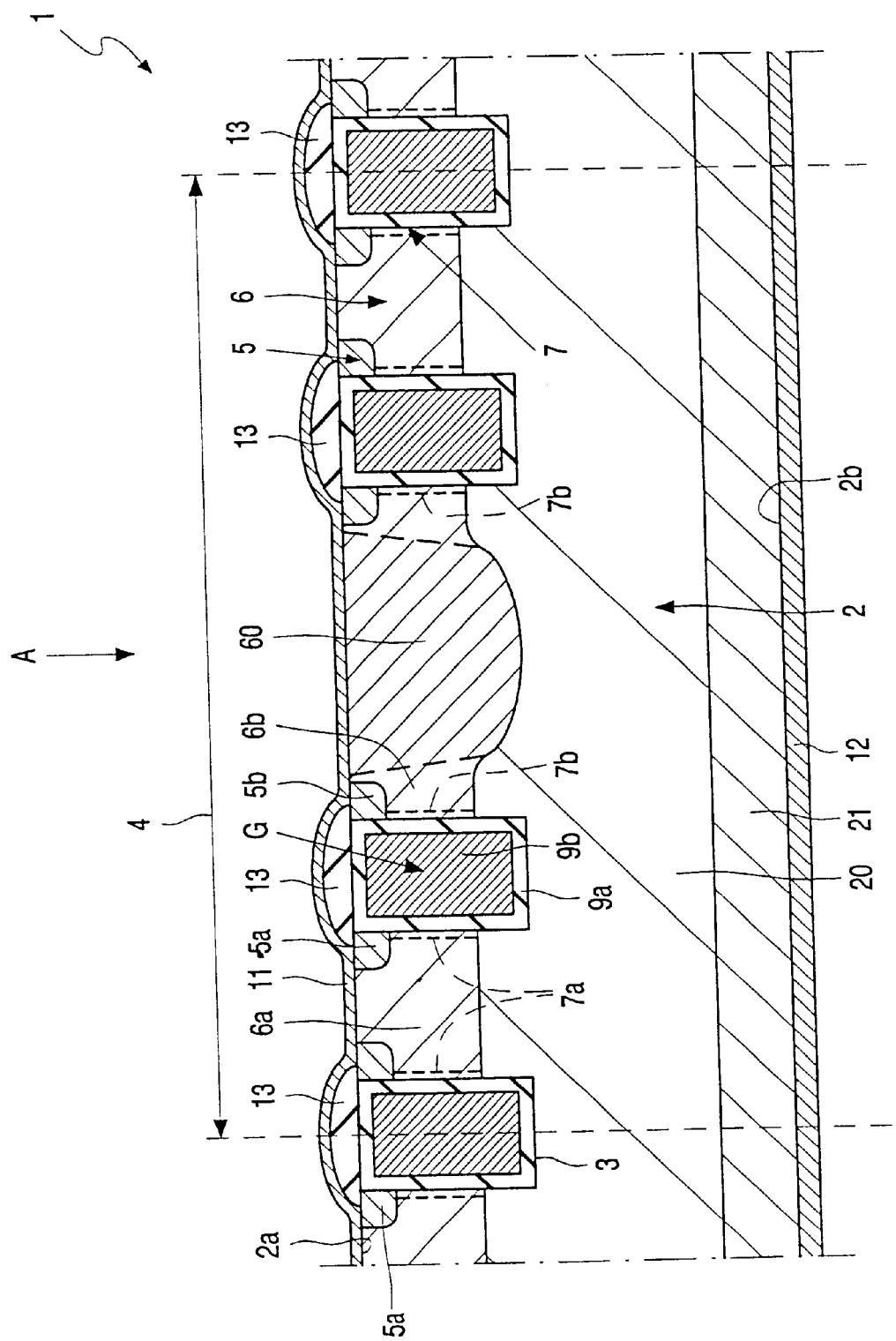
FIG. 2 shows a schematic cross-sectional view through part of the device illustrated by FIG. 1 so as to illustrate the structure of a unit cell of the trench gate field effect device shown in FIG. 1.

Referring now to FIGS. 1 and 2, there is illustrated a first embodiment of an electronic device comprising a trench gate field effect device in accordance with the present invention.

FIG. 2 shows a diagrammatic cross-sectional view through a source or unit cell 4 of the trench gate field effect device 1 while FIG. 1 shows a top plan view of part of an electronic device, that is a view taken in the direction of the arrow A in FIG. 2, but with surface features such as insulation and metallisation layers removed.

As shown most clearly in FIG. 2, the device 1 comprises a semiconductor body 2 having first and second opposed major surfaces 2a and 2b. A trench 3 extends into the first major surface 2a so as to define at the first major surface, as shown by the dashed line DL in FIG. 1, a regular array of polygonal source or unit cells 4 each bounded by the trench 3. FIG. 1 shows only one complete unit cell bounded by parts of the surrounding unit cells. However, as will be appreciated, where the device is a power device, it will consist of many typically tens of thousands of identical unit cells, that is all of the same geometry and of the same size.

Each polygonal source cell 4 contains a source region 5 of one conductivity type, in this example n conductivity type, and a body region 6 of the opposite conductivity type, in this example p conductivity type, with the body region 6 separating the source regions 5 from a common further region 20 (FIG. 2) of the one conductivity type. A gate G extends within and along the trench 3 to control a conduction channel 7 through each of the body regions 6 between the corresponding source regions 5 and the further region 20.

Each polygonal source cell 4 contains a central semiconductor region 60 of the opposite conductivity type which is more highly doped than the body region 6 and which forms a diode with the further region 20.

As shown in FIG. 1, the trench 3 defines an inner trench boundary 3a and an outer trench boundary 3b for each polygonal source or unit cell 4. The inner trench boundary 3a bounds a central subsidiary cell 10a containing the central semiconductor region 60. The trench 3 has a plurality of trench portions radiating outwardly from the inner trench boundary 3a to the outer trench boundary 3b. The trench portions 30 separate the area between the inner and outer trench boundaries 3a and 3b into a plurality of subsidiary peripheral cells 10b surrounding the central subsidiary cell 10a so that the subsidiary peripheral cells are enclosed within the outer trench boundary 3b.

As will be appreciated from FIG. 1, each subsidiary peripheral cell 10b is bounded by the trench with the trench boundary of each subsidiary peripheral cell 10b being defined by parts of the inner and outer trench boundaries and two adjacent trench portions 30.

Each subsidiary peripheral cell 10b has a subsidiary source region 5a and a subsidiary body region 6a with the subsidiary body region 6a providing all round the internal trench boundary of the subsidiary peripheral cell 10b a conduction channel area 7a through which a conduction channel between the associated subsidiary source region 5a and the further region 20 is controllable by the gate G.

In the embodiment shown in FIGS. 1 and 2, the trench gate device is an insulated gate trench device with the gate G formed within the trench 3 comprising a gate dielectric layer 9a formed on the walls of the trench and an electrically conductive material deposited within the trench on top of the gate dielectric layer 9a to form a conductive gate 9b (FIG. 2).

As shown in FIG. 2, an insulating layer is provided on the top or first major surface 2b and is patterned to define insulating regions 13 extending over the trench 3 onto part of the source regions 5 to enable subsequent metallisation to be deposited to form a source electrode 11. Although not shown in FIG. 2, it will, of course, be appreciated by the person skilled in the art that the metallisation used to form the source electrode 11 is patterned so as also to define a gate electrode which contacts the conductive gate 9b through a contact window formed in the insulation at a location electrically isolated from the source electrode 11.

In the example shown in FIGS. 1 and 2, the further common region 20 is an epitaxial layer of relatively high resistivity of the one conductivity type formed on a monocrystalline substrate 21 which is more highly doped but is of the same conductivity type. The substrate 21 is sufficiently highly doped so as to enable ohmic contact to be formed by subsequent metallisation 12 on the second major surface 2b. The device shown in FIGS. 1 and 2 thus forms a vertical insulated trench gate field effect transistor with the metallisation 11 and 12 forming the source and drain electrodes, respectively, of the transistor.

Typically, the semiconductor body comprises monocrystalline silicon and the conductive gate 9b is formed of conductive, that is highly doped, polycrystalline silicon. The doping of the substrate 21 and the source regions 5a is sufficient to provide ohmic contact to the metallisation. Typically the source regions have a doping concentration of $10^{19}$ to $10^{20}$ phosphorus or arsenic atoms cm$^{-3}$. Typically, the body regions 6 have a doping concentration of about $10^{16}$ to $2 \times 10^{17}$ boron atoms cm$^{-3}$.

As shown in FIG. 2, the central semiconductor region 60 extends further into the semiconductor body from the first major surface 2b than the body regions 6 and may extend to or beyond the bottom 31 of the trench 3. The central semiconductor region 60 may however be of the same depth as the body regions 6. The doping of the central semiconductor region will not be sufficient to overdope the source regions and typically will be in the region of $10^{18}$ to $10^{19}$ boron atoms cm$^{-3}$.

The trench insulated gate field effect transistor structure shown in FIG. 2 may be fabricated using any known techniques and the actual cross-sectional structure especially the actual structure of the trench insulated gates may differ from that shown in FIG. 2. For example, the fabrication methods described in U.S. Pat. No. 5,378,655 or EP-A-0746030 may be used to form the insulated gate field effect transistor shown in FIG. 2.

Returning now to FIG. 1, in this embodiment, the unit cells 4 are hexagonal and are arranged in a hexagonal close packed array. Both the inner and outer trench boundaries 3a and 3b have the form of regular hexagons with the inner and outer trench boundaries being coaxial with one another and their axes of symmetry coincident so that each side of the hexagonal inner trench boundary is parallel to the corresponding side of the outer trench boundary 3a.

In each unit cell 4, each trench portion 30 radiates outwardly from a respective different corner of the hexagonal inner trench boundary 3a to the corresponding corner of the outer hexagonal 3b so that there are six trench portions 30 and so that each of the subsidiary peripheral cells 10b has the shape of half a hexagon with one side (the radially outermost side 10b' in FIG. 1) being longer than another side. Depending upon the relative sizes of the hexagonal inner and outer trench boundaries 3a and 3b, the half-hexagonal subsidiary peripheral cells may be equivalent in size to half of the hexagonal central subsidiary cell 10a. Forming the subsidiary peripheral cells as half hexagons of the same size as half of the subsidiary cell provides a greater amount of channel per unit area than could be achieved if the subsidiary peripheral cells were formed by larger half hexagons. It should be understood that, as used herein, the term "radiates outwardly" means that the trench portions each lie on a respective different line passing through the centre C of the unit cell.

As explained above, each unit cell 10 of the trench insulated gate field effect transistor shown in FIGS. 1 and 2 has a central highly doped semiconductor region which forms a body diode with the drain drift region 20. As is appreciated by those skilled in the art this body diode provides voltage clamping and controls the location of avalanche breakdown and the hole current flow path in the unit cell moving it away from the trench 3 so as to improve the ruggedness of the device. The trench insulated gate field effect transistor shown in FIGS. 1 and 2 also has an improved (that is lowered) ON resistance because, as will be explained below, the presence of the radially outwardly extending trench portions 30 separating the unit cell 4 into a plurality of peripheral subsidiary source cells 10b enables the overall channel width per unit area of the device and thus the source-drain current to be increased for the same device surface area.

As mentioned in the introduction, the specific ON resistance ($R_{DSon}$) is defined as:

$$R_{DSon} = \frac{V_{DS}}{J_{DS}} \cdot \frac{A}{Z} \qquad 1)$$

where $V_{DS}$ is the drain-source voltage, $J_{DS}$ is the drain-source current per unit length, A is the active device area (that is the device area excluding any field relief or other passive termination) and Z is the perimeter of the current flow along the device.

Figure 3:
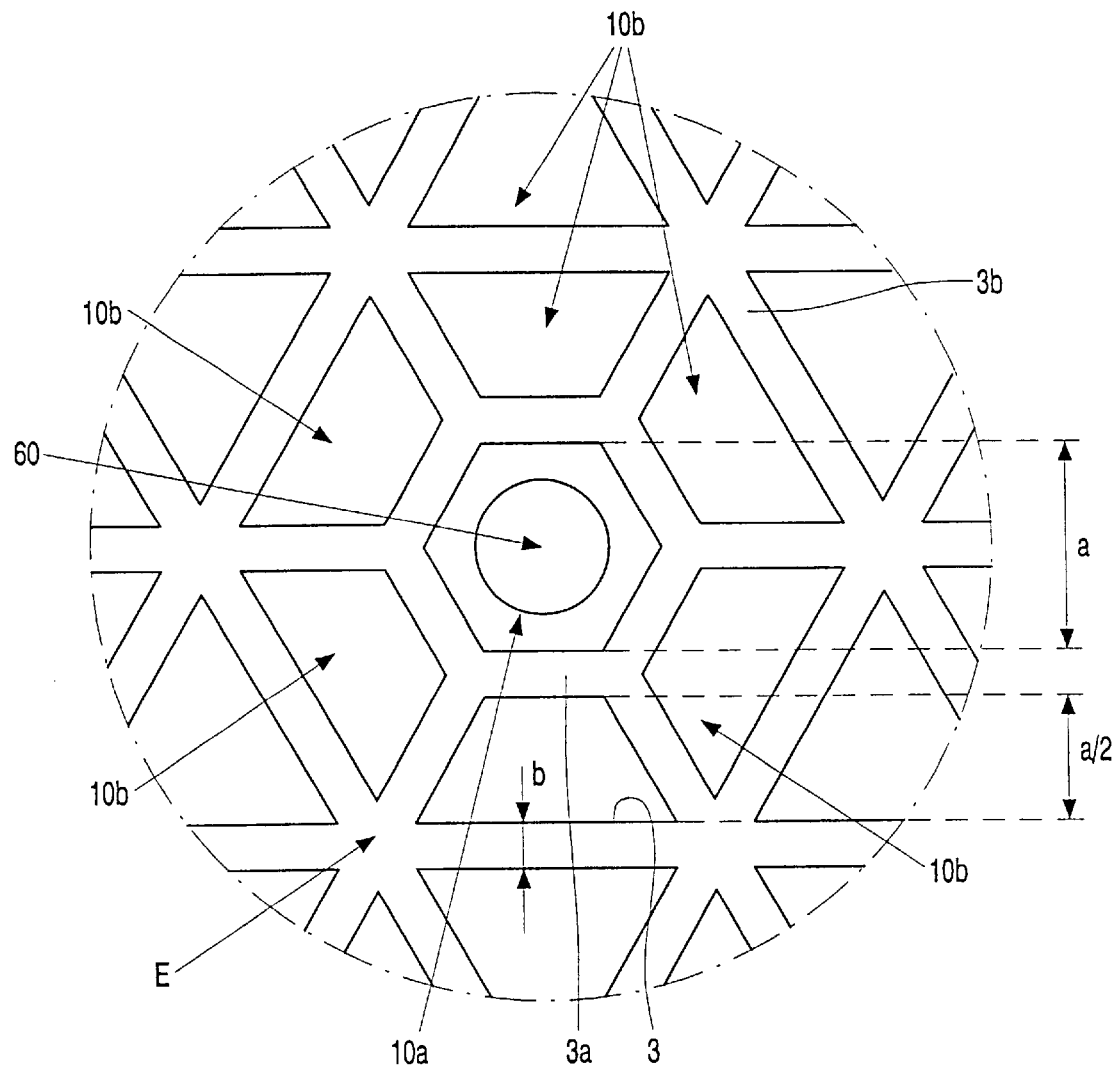
FIG. 3 shows a simplified version of the top plan view shown in FIG. 1 for explaining the geometric layout of the source or unit cell.

The specific ON resistance $R_{DSon}$ for the device shown in FIGS. 1 and 2 will now be determined with the help of FIG. 3 which shows schematically the geometric layout of the trench 3 for the device shown in FIGS. 1 and 2.

It will be appreciated from equation 1 above that, for a given drain-source voltage and drain-source current per unit length, the specific ON resistance will be determined by the ratio A/Z. In a conventional hexagonal unit cell having a single hexagonal trench boundary bounding a single source region contained within a corresponding body region, this ratio is given by:

$$\frac{A}{Z} = \frac{(a+b)^2}{4a} \qquad 2)$$

where a is the body region width and b is the trench width (see FIG. 3).

For the unit cell 10 shown in FIGS. 1 and 2, this ratio is given by:

$$\frac{A}{Z} = \frac{2\sqrt{3}(a+b)^2 + 3ab}{8a\sqrt{3} + 6a} \qquad 3)$$

The following Table 1 shows calculations of the ratio A/Z for body widths a from 1 to 15 μm (micrometres) with, in each case, a trench width b of 2.3 μm. The second column in Table 1 shows the ratio A/Z for the unit cell 10 shown in FIG. 1 while the third column shows the same ratio A/Z for a conventional hexagonal cell. The final column four in Table 1 shows the percentage difference Δ between the ratio A/Z for the conventional hexagonal unit cell and A/Z for the unit cell shown in FIG. 1. It will be seen from Table 1 that A/Z is reduced by 20–30% with commensurate reduction in $R_{DSon}$.

TABLE 1

| body width a [μm] | A/Z FIG. 1 unit cell [μm] | A/Z Prior Art Hexagon unit cell [μm] | Δ [%] |
| --- | --- | --- | --- |
| 0  | —    | —    | —    |
| 1  | 2.25 | 2.72 | 20.9 |
| 2  | 1.96 | 2.31 | 17.9 |
| 3  | 1.98 | 2.34 | 18.2 |
| 4  | 2.08 | 2.48 | 19.2 |
| 5  | 2.21 | 2.66 | 20.4 |
| 6  | 2.35 | 2.87 | 22.1 |
| 7  | 2.50 | 3.09 | 23.6 |
| 8  | 2.66 | 3.32 | 24.8 |
| 9  | 2.82 | 3.55 | 25.9 |
| 10 | 2.99 | 3.78 | 26.4 |
| 11 | 3.15 | 4.02 | 27.6 |
| 12 | 3.32 | 4.26 | 28.3 |
| 13 | 3.49 | 4.50 | 28.9 |
| 14 | 3.66 | 4.74 | 29.5 |
| 15 | 3.83 | 4.99 | 30.3 |

As shown in FIG. 2, in the device shown in FIGS. 1 and 2 the central subsidiary cell 10a of each unit cell also forms a subsidiary source cell having a subsidiary source region 5b formed within a subsidiary body region 6b defining a conduction channel area 7b from the subsidiary source region 5b to the drain drift region 20. This means that even the central subsidiary cell 10a also contribuites to the overall channel width of the device and thus assists in reducing the specific ON resistance. However, if desired the central subsidiary cell 10a may be an inactive cell and may consist simply of the central semiconductor or ruggedness region 60. Leaving out the subsidiary source region 5b would enable a reduction in the overall area occupied by a unit cell at the expense of the loss of the channel area that would otherwise have been provided by the central subsidiary cell. Depending on the particular geometry, omitting the subsidiary source region may reduce the overall avalanche channel and thus cause an increase in $R_{DSon}$ because the subsidiary central would not contribute to Z.

As shown in FIG. 2, the source metallisation 11 shorts the subsidiary source regions 5a, 5b to their corresponding subsidiary body regions 6a, 6b in conventional manner so as to inhibit parasitic bipolar action. However, this need not necessarily be the case and the subsidiary body regions 6a of the peripheral subsidiary source cells may be floating with the insulating layer 13 being patterned so as also to cover the subsidiary body regions 6a. This may enable a smaller on-resistance $R_{DSon}$ because the source contact and thus the overall unit cell could be made smaller so that less area A is needed for a given Z but may adversely affect the ruggedness of the device.

It will be appreciated that the trench 3 will be of uniform width b except parts of the trench intersect at a junction. In order to facilitate manufacture of the device and to reduce the electric fields at the corners, the width of the trench 3, shown in FIGS. 1 and 2, may be increased locally near the corners, in particular the corners between the outer trench boundary 3b and the trench portions 30 so as to reduce the sharpness of those corners.

Further embodiments of the present invention will now be described in which the trench insulated gate field effect transistor has a unit or source cell with a different geometric layout from that shown in FIG. 1 but has a construction similar to that described above with reference to FIG. 2. Accordingly, in each of the following embodiments, only the geometric layout will be described in detail.

Figure 4:
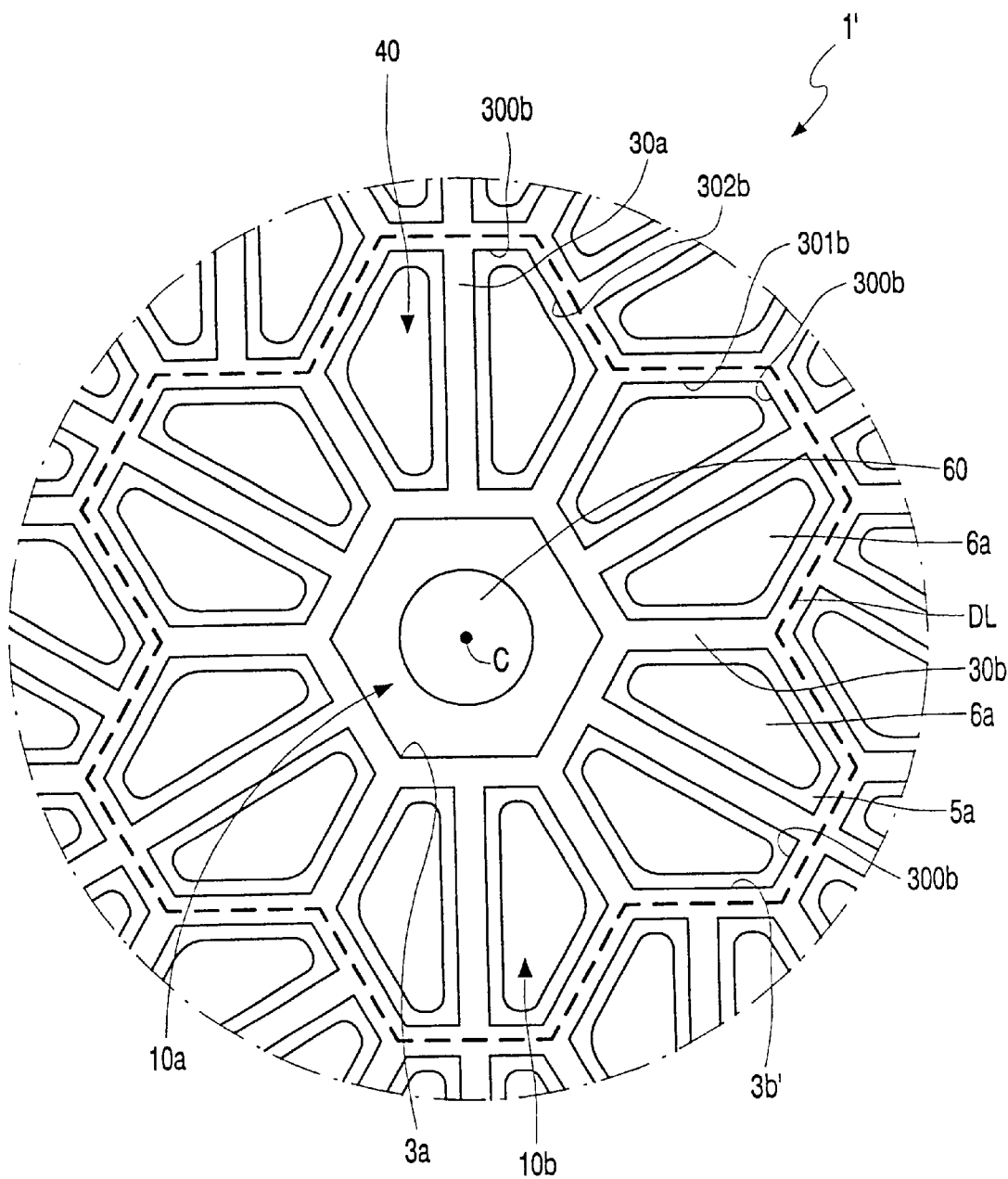
FIG. 4 shows a top plan view similar to FIG. 1 for illustrating the geometric layout of a source or unit cell of a second embodiment of a device in accordance with the present invention.

FIG. 4 shows the geometric layout of a unit or source cell 40 (again defined by the dashed line DL) of a second embodiment of an electronic device 1 comprising a trench insulated gate field effect transistor in accordance with the invention. In the arrangement shown in FIG. 4 the trench is again of uniform width away from the intersections and the inner trench boundary 3a still has the shape of a hexagon. However, in this example, the outer trench boundary 3b' has a castellated or corrugated form and consists of a series of sides or edges 300b each of the same length as and arranged parallel to a corresponding side or edge of the hexagonal inner trench boundary with adjacent sides or edges 300b being joined together by first and second consecutive sides or edges 301b and 302b so that (from the direction of the inner trench boundary) the side or edge 301b subtends an angle of 60° with the adjacent edge 300b, the adjacent side or edge 302b subtends an angle of 300° with the edge 301b and an angle of 60° with the adjacent edge 300b. That is the edges 300b, 301b and 302b are at 60° to one another.

The unit cell 40 shown in FIG. 4 has trench portions 30a each extending from the midpoint of a side of the hexagonal inner trench boundary 3a to the midpoint of the corresponding side or edge 300b of the outer trench boundary and trench portions 3b' each extending from a corner of the inner hexagonal trench boundary 3a to the intersection between the corresponding edges 301b and 302b such that each subsidiary peripheral cell 10b is again of different shape from the central cell, is irregular and has the shape of a half hexagon. In the embodiment shown the half hexagon subsidiary peripheral cells are the same size as half of the hexagonal central cell 10a.

Figure 5:
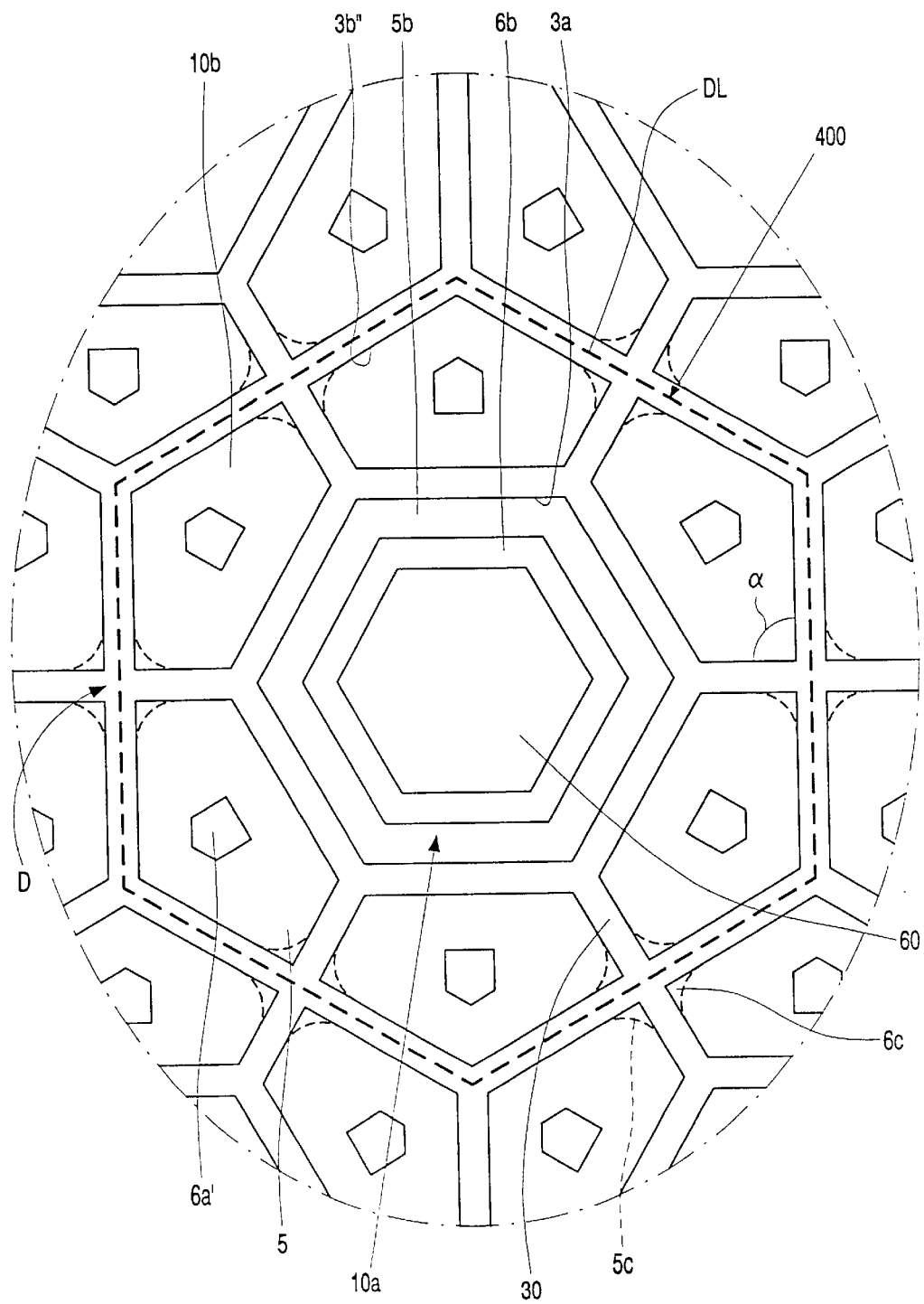
FIG. 5 shows a top plan view similar to FIGS. 1 and 4 for illustrating the geometric layout of a source or unit cell of a third embodiment of a device in accordance with the present invention.

The unit cell 40 shown in FIG. 4 enables the sharp corners between the trench portions 30 and the outer trench boundary 3b in FIG. 1 to be avoided so alleviating the problem of high fields at these corners. FIG. 5 shows the geometric layout for the source or unit cell 400 of a further embodiment of a trench insulated gate field effect transistor in accordance with the invention.

As shown in FIG. 5, the trench is again of uniform width away from the intersections and the inner and outer trench boundaries 3a and 3b' are, as in FIG. 1, again both hexagonal and coaxial. However, in the layout shown in FIG. 5, the three axes of symmetry of the hexagonal outer trench boundary 3b'' are rotated through 30° with respect to the axes of symmetry of the hexagonal inner trench boundary and each trench portion 30 extends from a corner of the hexagonal inner trench boundary 3a to the midpoint of the closest side of the hexagonal outer trench boundary 3b''. This avoids the problems of the sharp corners discussed above with reference to FIG. 1 with the smallest angle α in FIG. 5 being approximately 90° whilst also avoiding the relatively complex structure shown in FIG. 4. In addition, because in the geometric layout shown in FIG. 5 the maximum number of parts of the trench meeting at an intersection or crossroads is four (for example at the point indicated by the arrow D in FIG. 5) whereas the maximum number of parts of the trench meeting at a crossroads in FIG. 1 is six (as indicated by the arrow E in FIG. 1), the trench intersections or crossroads in the layout shown in FIG. 5 can be made smaller than the trench junctions or crossroads in the layout shown in FIG. 1. For example, where the width of the trench is normally 1 μm, then the widest trench crossroads or intersections with the geometry shown in FIG. 5 are approximately 1.6 μm whereas in the layout shown in FIG. 1, the widest crossroads or intersections are approximately 2 μm for the same nominal 1 μm trench network.

The source or unit cell 400 of the trench insulated gate field effect transistor shown in FIG. 5 also differs from that shown in FIG. 1 in that the mask used to introduce the source regions 5 is defined so that the areas 6'a of the p body regions that meet the surface 2a to enable formation of the p body short are smaller and have the form of an irregular pentagon. This is done simply for ease of photolithography and it will be appreciated that the area 6'a shown in FIG. 5 may have the shape shown in FIGS. 1 and 4 or vice versa.

In each of the embodiments described above, one or more of the inner and outer trench boundaries is of hexagonal form. However, other shapes for the inner and outer trench boundaries are possible with the constraint that the unit cells should be capable of close packing so as to make effective and efficient use of the available semiconductor area. Such constraints are not necessary for the inner trench boundary and, for example, the inner trench boundary need not be polygonal but may be, for example, circular.

As discussed above, the embodiments shown in FIGS. 4 and 5 have the advantage over the embodiment shown in FIG. 1 of avoiding sharp corners. This is however at the expense of providing less channel width per unit area and thus also of a higher on-resistance $R_{DSon}$. Of those three embodiments, FIG. 1 should provide the lowest $R_{DSon}$ with FIG. 5 providing the highest. The problem of high fields at the sharp corners in FIG. 1 may be overcome or at least alleviated by modifying the mask used to introduce the source regions 5 so that, as indicated by the dashed lines 5c in FIG. 1, source regions 5 do not extend completely into the sharp corners of the peripheral subsidiary source cells 10b. This should avoid or at least reduce the problem of high electric fields at the sharp corners for the loss of a very small amount of the overall channel width. The same approach may also be adapted for the embodiments shown in FIGS. 4 and 5 if considered necessary, for example as shown by the dashed lines 5c in FIG. 5 for the sharp approximately 90° corners. The modified mask may have any appropriate shape so that the area of the body region 6c that reaches the surface 2a in the corners may have any desired shape. It is of course desirable that this modification avoids introducing sharp edges to the boundaries between the source and body regions and between the source or body regions and the trench 3.

FIGS. 6 to 15 are very diagrammatic sketches illustrating other source or unit cell configurations 401 to 406 where, in each case, each of the inner and outer trench boundaries 3a and 3b is of square (rectangular) configuration.

FIGS. 6 to 15 show only the trench 3 of the device and this is shown simply as a single line.

Figure 6:
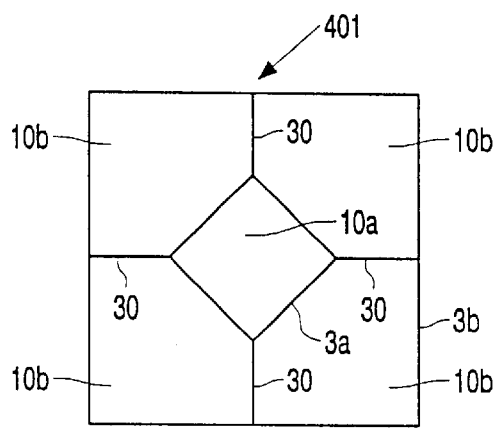
FIGS. 6 to 15 are very schematic diagrams for illustrating geometric layouts for the source or unit cells of other embodiments of devices in accordance with the present invention.

In the unit cell 401 shown in FIG. 6, the axes of symmetry of the square inner trench boundary 3a are offset by 45° (half the angle between the axes of symmetry) from the axes of symmetry of the outer trench boundary 3b and the trench portions 30 extend from corners of the inner trench boundary 3a to the midpoints of the corresponding sides of the outer trench boundary 3b.

Figure 7:
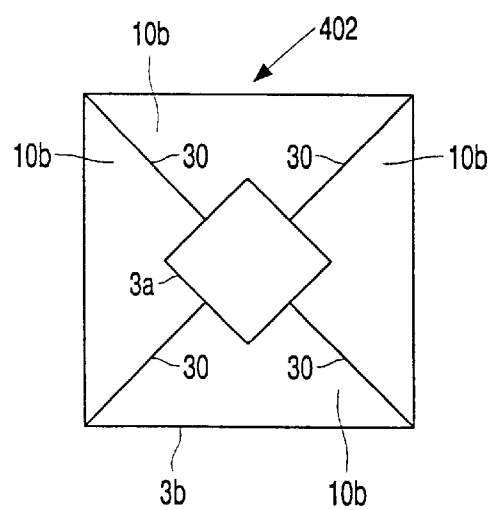

FIG. 7 shows a modification of the layout shown in FIG. 6 in which the unit cell 402 has trench portions 30 extending from corners of the outer trench boundary 3b to the midpoints of the sides of the inner trench boundary. This arrangement has, however, as noted above with reference to FIG. 1, the disadvantage that the sharp angles between the edges of the outer trench boundary are undesirable because of the likelihood of high fields occurring at the sharp corners.

Figure 8:
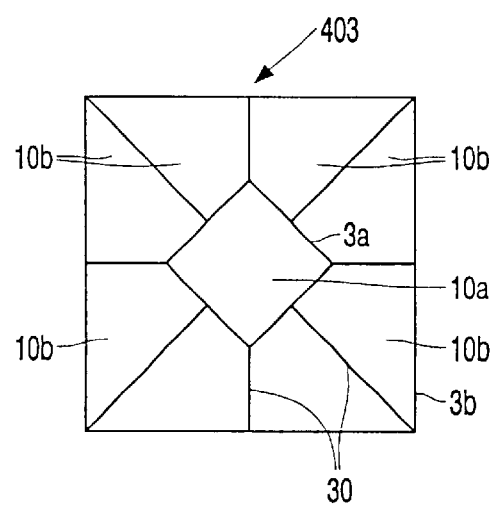

FIG. 8 illustrates a further modification in which the unit cell 403 has both the trench portions 30 shown in FIG. 6 and the trench portions 30 shown in FIG. 7 are present. This has the advantage of further increasing the available channel width by increasing the number of trench portions 30 but again has the disadvantage of the sharp corners between the diagonally extending trench portions 30 and the edges of the outer trench boundary 3b.

Figure 9:
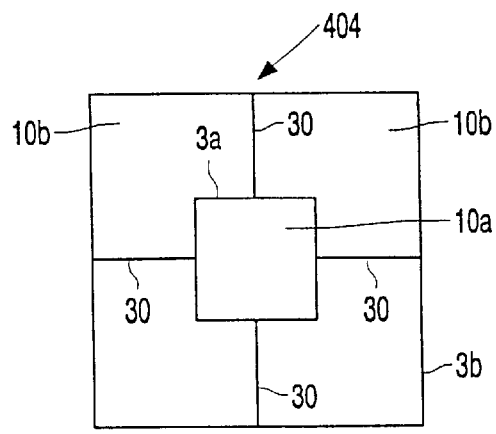

FIG. 9 illustrates a further source or unit cell 404 layout wherein both the inner and outer trench boundaries are square but in this case their axes of symmetry are coincident. In the arrangement shown in FIG. 9. In the unit cell 405 shown in FIG. 10, the trench portions 30 extend between opposed midpoints of edges of the inner and outer trench boundaries.

Figure 10:
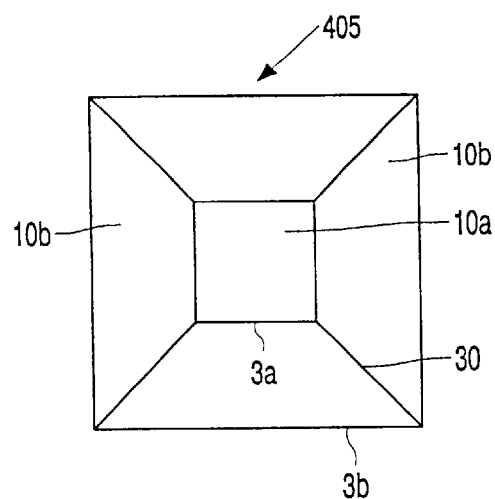

FIG. 10 illustrates a modification of the unit cell shown in FIG. 9. In the unit cell 405 shown in FIG. 10 in which the trench portions 30 extend between corresponding corners of the inner and outer trench boundaries. Again, the arrangement shown in FIG. 10 may increase the overall channel width with respect to the arrangement shown in FIG. 9 because the trench portions 30 shown in FIG. 10 are longer than those shown in FIG. 9. However this is at the expense of sharp corners between the trench portions 30 and the edges of the outer trench boundary 3b which may result in undesirable high fields.

Figure 11:
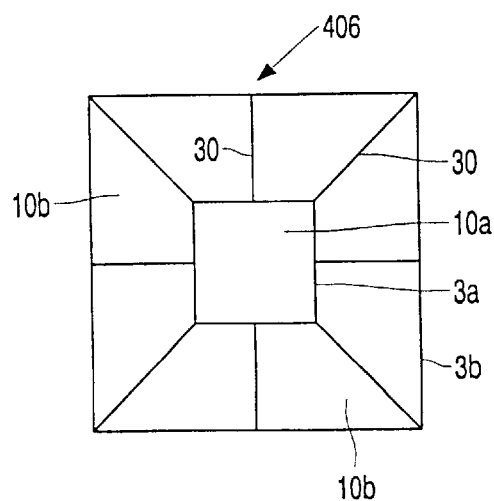

FIG. 11 illustrates a further source or unit cell 406 layout in which the inner and outer trench boundaries are again square and have their axes of symmetry coincident. In this case, trench portions 30 extend between corresponding corners and also between the midpoints of opposed edges. This has the advantage of increasing the overall channel width in comparison to the arrangement shown in FIG. 9 or FIG. 10 but like FIG. 10 has the disadvantage of the sharp corners between the diagonal trench portions 30 and the edges of the outer trench boundary.

Figure 12:
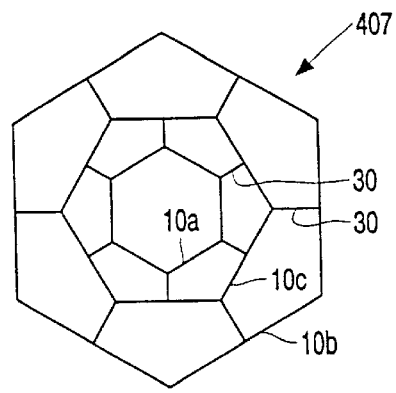
Figure 13:
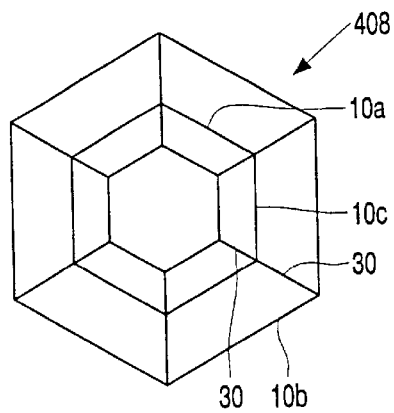
Figure 14:
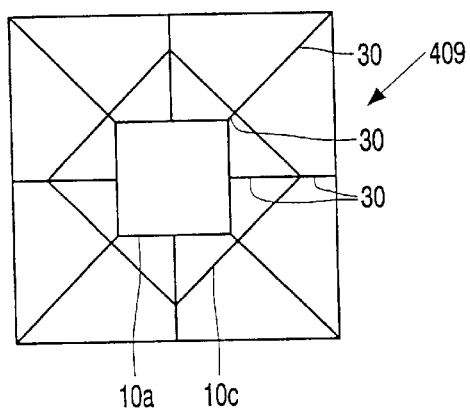
Figure 15:
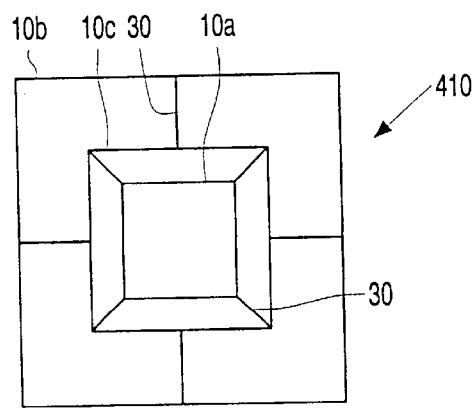

It will be appreciated that the inner trench boundaries 3a in FIGS. 6 to 11 may be circular as discussed above and need not necessarily be polygonal. Further source or unit cell geometries are possible where, for example, one of the inner and outer trench boundaries is hexagonal and the other is square. FIGS. 12 to 15 show further examples of unit cells 407, 408, 409 and 410 for a device embodying the invention. Each of these unit cells 407, 408, 409 and 410 has a further intermediate trench boundary 10c between the trench boundaries 10a and 10b with the trench boundaries being hexagonal in FIGS. 12 and 13 and square in FIGS. 14 and 15. The inner and intermediate trench boundaries 10a and 10c are connected by radially extending trench portions 30 as are the intermediate and outer trench boundaries 30 so defining two concentric sets of subsidiary source cells 10b. In FIGS. 12 and 15 the trench portions 30 extending between the inner and intermediate trench boundaries 10a and 10c are offset by half the angle between the axes of symmetry of the trench boundary 10b from the trench portions 30 between the intermediate and outer trench boundaries 10c and 10b. Where sharp corners exist in the trench boundaries shown in FIGS. 6 to 15, then, as discussed above, the problem of high fields at these sharp corners can be avoided or at least alleviated by shaping the source regions 5 so that they do not extend into the sharp corners.

It will be appreciated that the overall channel width could in each of the described embodiments be increased by adding further radially extending trench portions or spokes. However, the minimum size of the subsidiary cells will, of course, be limited by photolithographic considerations.

In each of the embodiments described above, the trench gate field effect device is an insulated gate field effect transistor. However, the present invention may also be applied where the gate is not an insulated gate but is a so-called Schottky gate in which the gate dielectric layer is absent and the conductive gate is formed of a metal that forms a Schottky barrier with the lowly doped channel area so that the Schottky gate capacitively couples to the channel area by means of the depletion layer present at the Schottky barrier. Also, it will be appreciated by those skilled in the art that the present invention could be applied to the case where the source regions are formed as Schottky source regions, that is by forming a Schottky barrier between a metallisation layer and the body regions.

In each of the embodiments described above, the trench gate field effect device is an insulated gate field effect transistor. However, the present invention may be applied to trench insulated gate bipolar transistors (IGBTs) by providing the substrate 21 of the opposite conductivity type or by providing regions of the opposite conductivity type meeting the second major surface 2b and extending through the region 21 so as to form a so-called anode shorted insulated gate bipolar transistor.

It will, of course, be appreciated that the conductivity types mentioned above could be reversed so as to provide a p conductivity type channel rather than an n conductivity type channel field effect device. Also, although the embodiments described above are enhancement mode (normally OFF) devices. The invention may be applied to depletion mode devices.

It will also be appreciated that although the above-mentioned devices are formed in a monocrystalline silicon body, the present invention may also be applied to the formation of such devices in other semiconductor materials such as silicon-germanium (SiGe), silicon-carbide (SiC), germanium and III–V or II–VI semiconductor materials.

Also although FIG. 2 shows a vertical trench field effect device with the source and drain electrodes 11 and 12 being provided on opposed surfaces of the semiconductor body, the present invention may be applied to vertical trench field effect devices where, although the major current path is between the first and second major surfaces, the drain contact 12 is on the same surface as the source contact 11.

From reading the present disclosure, other variations and modifications will be apparent to a person skilled in the art. Such variations and modifications may involve equivalent or other features which are already known in the design, manufacture and use of semiconductor devices and component parts thereof and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The applicants hereby give notice that new claims may be formulated to any such features and/or combinations of such features during the prosecution of the present application or of any further application derived therefrom.

What is claimed is:

1. An electronic device comprising a trench gate field effect device, comprising a semiconductor body having first and second opposed major surfaces, a trench extending into the first major surface so as to define at the first major surface a regular array of polygonal source cells each bounded by the trench, each polygonal source cell containing a source region and a body region with the body regions separating the source regions from a common further region, and a gate extending within and along said trench for controlling a conduction channel through each of the body regions between the corresponding source region and the further region, each polygonal source cell containing a central semiconductor region which is more highly doped than said body regions and which is of opposite conductivity type to the further region and forms a diode with the further region, characterised in that, for each polygonal source cell, said trench defines an inner trench boundary and an outer polygonal trench boundary with the inner trench boundary bounding a central subsidiary cell containing the central semiconductor region, the trench having a plurality of trench portions radiating outwardly from the inner trench boundary to the outer trench boundary and separating the area between the inner and outer trench boundaries into a plurality of segments such that each segment has a boundary with a plurality of sides provided by the trench with at least one side longer than at least one other, each segment forming a subsidiary source cell having a subsidiary source region and a subsidiary body region with the subsidiary body region providing adjacent the boundary of the segment a conduction channel area through which a conduction channel between the associated subsidiary source region and the further region is controllable by the gate within the trench.

2. A device according to claim 1, wherein the inner trench boundary of each polygonal source cell is also polygonal and the trench portions radiate from corners of the polygonal inner trench boundary.

3. A device according to claim 1, wherein the inner and outer trench boundaries of each polygonal source cell are coaxial hexagons and the trench portions extend between corresponding corners of the hexagonal inner and outer hexagonal trench boundaries.

4. A device according to claim 1, wherein the inner trench boundary is hexagonal and the trench portions radiate outwardly from said inner trench boundary to said outer trench boundary so that each subsidiary source cell forms half a hexagon.

5. A device according to claim 4, wherein the outer trench boundary of each polygonal source cell is also hexagonal and each half hexagon subsidiary source cell is defined by two adjacent trench portions and corresponding parallel sides of the hexagonal inner and outer trench boundaries.

6. A device according to claim 4, wherein each half hexagon subsidiary source cell is defined by the outer trench boundary and by a trench portion radiating from a corner of the inner trench boundary to the outer trench boundary and a further trench portion extending from a midpoint of a side of the inner trench boundary to a side of the outer trench boundary parallel to that side.

7. A device according to claim 1, wherein the inner and outer trench boundaries are coaxial hexagons with the inner trench boundary being rotated relative to the outer trench boundary by thirty degrees and the trench portions extend from corners of one of the inner and outer trench boundaries to the midpoints of the sides of the other of the inner and outer trench boundaries.

8. A device according to claim 7, wherein the trench portions extend from corners of the inner trench boundary to the midpoints of the sides of the outer trench boundary.

9. A device according to claim 1, wherein the inner and outer trench boundaries of each polygonal source cell are similar coaxial polygons and their rotational axes of symmetry are coincident, with each trench portion separating adjacent subsidiary source cells extending between a respective different corner of the inner trench boundary and a corresponding corner of the outer trench boundary.

10. A device according to claim 1, wherein the inner and outer trench boundaries of each polygonal source cell are similar coaxial polygons, their rotational axes of symmetry are offset by half the angle between adjacent ones of the axes of symmetry and each trench portion separating adjacent subsidiary source cells extends between a respective different corner of one of the inner and outer trench boundaries and the midpoint of a corresponding side of the other of the inner and outer trench boundaries.

11. A device according to claim 1, wherein at least some of said central subsidiary cells also contain a subsidiary source region and a subsidiary body region separating the subsidiary source region from the further region and providing adjacent the inner trench boundary a conduction channel area through which a conduction channel between the subsidiary source region and the further region is controllable by the gate.

12. A device according to claim 1, wherein the source regions do not extend completely into at least some of the corners of the subsidiary source cells.

13. A device according to claim 1, wherein each subsidiary source region is electrically shorted to the corresponding subsidiary body region.

14. A device according to claim 1, wherein the further region comprises a drain region meeting the second major surface of the semiconductor body.

* * * * *